(12) United States Patent
Thallner

(10) Patent No.: US 6,214,692 B1
(45) Date of Patent: Apr. 10, 2001

(54) METHOD AND APPARATUS FOR THE ALIGNED JOINING OF DISK-SHAPED SEMICONDUCTOR SUBSTRATES

(76) Inventor: Erich Thallner, Bubing 71, A-4780 Schärding (AT)

( * ) Notice: Subject to any disclaimer, the term of this patent is extended or adjusted under 35 U.S.C. 154(b) by 0 days.

(21) Appl. No.: 09/224,172

(22) Filed: Dec. 31, 1998

(30) Foreign Application Priority Data

Jan. 13, 1998 (AT) .................................................. A-29/98

(51) Int. Cl.[7] .................................................. H01L 21/76
(52) U.S. Cl. .......................... 438/401; 438/410; 438/258; 29/588; 29/589
(58) Field of Search .................................... 438/401, 410, 438/258; 29/588, 589

(56) References Cited

U.S. PATENT DOCUMENTS 4,461,567 * 7/1984 Mayer ..................................... 355/41

* cited by examiner

Primary Examiner—Amir Zarabian
Assistant Examiner—Pho Luu
(74) Attorney, Agent, or Firm—Collard & Roe, P.C.

(57) ABSTRACT

In the method for the aligned joining of wafers (8, 11), the wafers (8, 11) are adjusted to a parallel position of their sides facing towards each other, are aligned according to alignment marks provided on these sides, and are then joined in a processing station (1). Both wafers (8, 11) are mounted on substrate carriers (5, 10), of which the one can be moved in only one direction from the processing station (1) into a measuring station (2), whereas the other one can in addition be adjusted in two further coordinate directions and can slightly be rotated about a vertical axis. In the measuring station there are provided microscope units with coaxial lenses (26, 27) facing towards each other. Upon introducing the first wafer (8), the microscope units are adjusted to its alignment marks. The wafer (8) is then moved back into the processing station, and the other wafer (11) on the second substrate carrier (10) is introduced into the measuring station (2), where it is brought to coincidence with the lenses (26) of the microscope units by means of its alignment marks, in this position is moved back into the processing station (1), and applied against the first wafer (8) with the alignment marks now precisely aligned. There is provided an apparatus for performing the method.

6 Claims, 5 Drawing Sheets

FIG.2
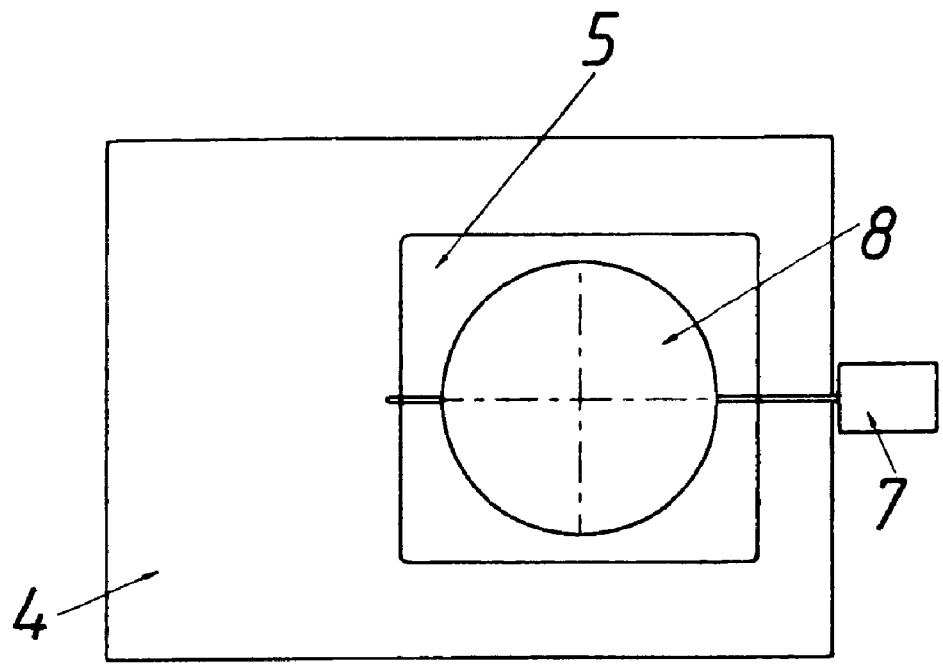
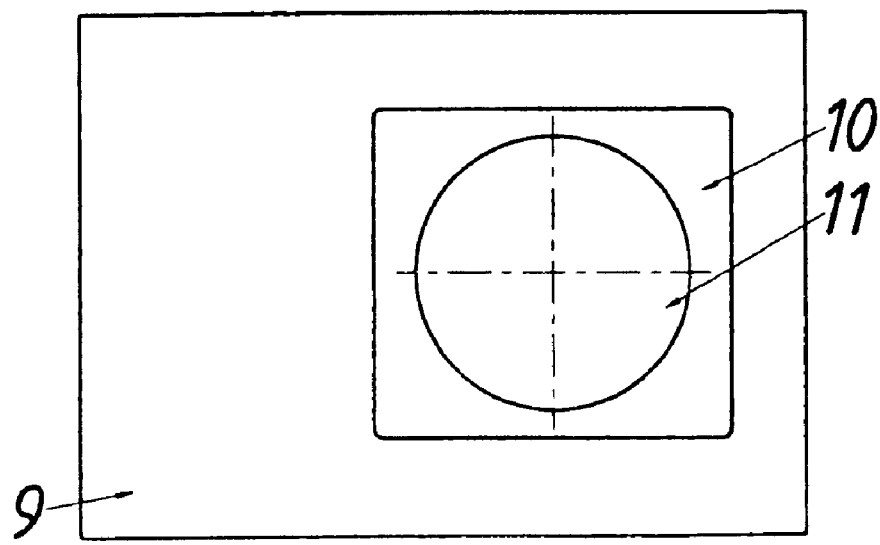

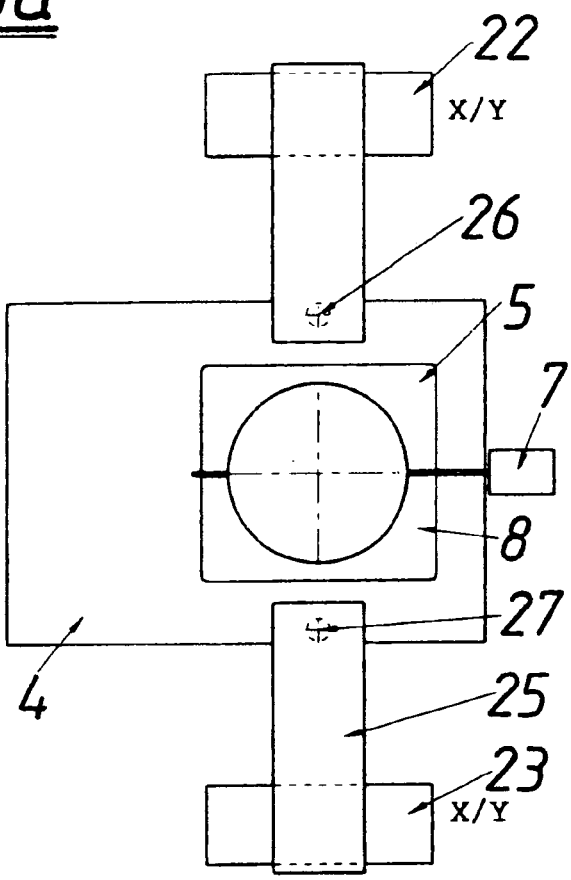
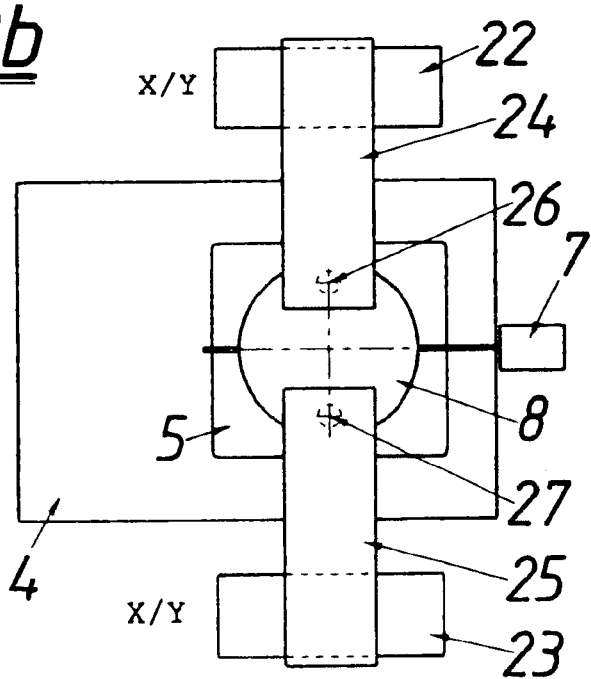

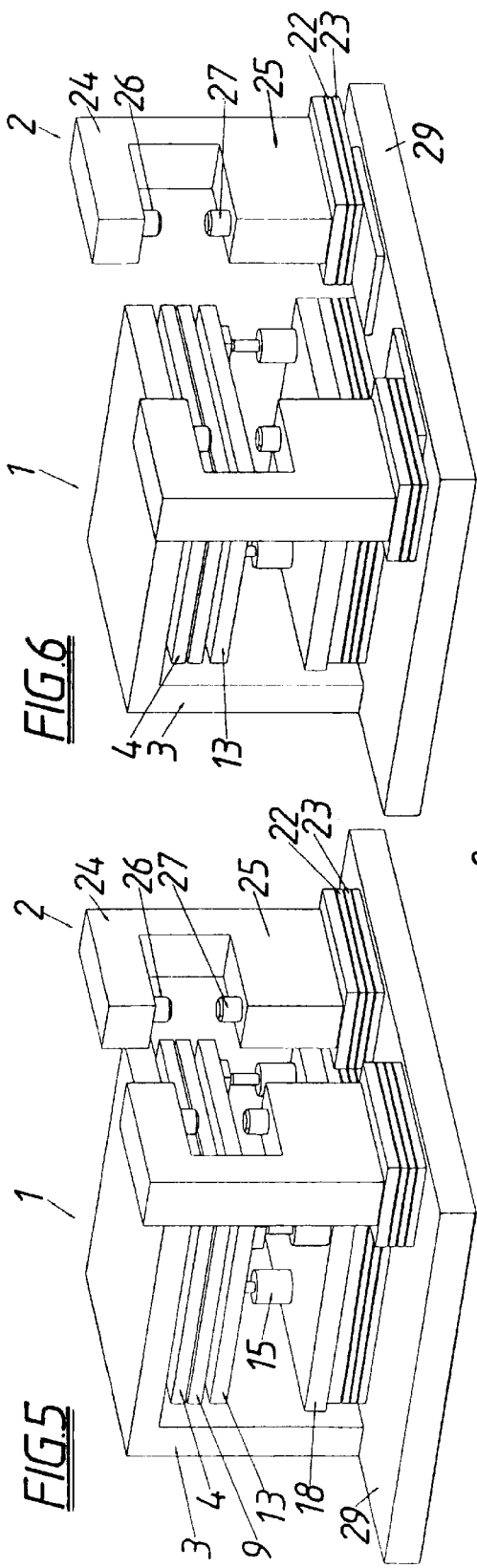
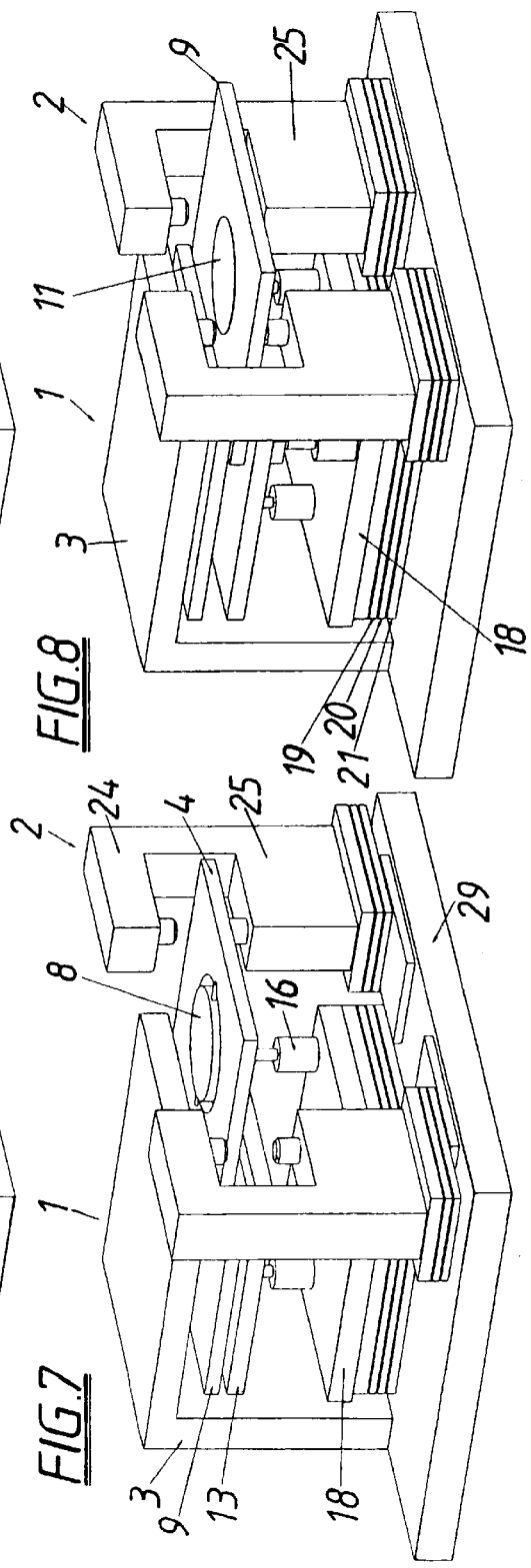

METHOD AND APPARATUS FOR THE ALIGNED JOINING OF DISK-SHAPED SEMICONDUCTOR SUBSTRATES

FIELD OF THE INVENTION

This invention relates to a method for the aligned joining of disk-shaped semiconductor substrates, so-called wafers, provided with alignment marks, which are held on substrate carriers, wherein the wafers are adjusted to a parallel position of their sides facing towards each other, are aligned according to alignment marks provided on these sides, and are then joined, where for detecting the alignment marks to be brought to coincidence there are used microscope units with coaxial lenses directed towards opposite sides.

DESCRIPTION OF THE PRIOR ART

This invention also relates to an apparatus for performing this method, comprising a processing station used for joining the semiconductor substrates having alignment marks, in which processing station two substrate carriers are provided for holding one semiconductor substrate each, of which the second substrate carrier can be moved with respect to the first substrate carrier in the three coordinate directions by means of actuators and can be rotated about an axis extending normal to the supporting plane of the semiconductor substrate, measuring means and actuators for determining and adjusting the relative positions of the two substrate carriers and of the substrates held on the same, and microscope units with coaxial lenses directed towards opposite sides for monitoring the mutual alignment of the semiconductor substrates by detecting pairs of alignment marks provided on their sides to be mounted opposite each other.

Such methods and apparatuses are required to provide for a rather precise alignment of two wafers, which must be joined or which complete each other. In the microstructures commonly used in semiconductor technology, the alignment accuracy achievable by means of mechanical alignment aids, e.g. flats or notches at the edge of the wafer, is not sufficient, so that corresponding methods and apparatuses must be used for fine alignment, which mostly concerns only fractions of a millimeter, but accuracies in the $\mu$-range and below.

A method and an apparatus as described above are known from practice in such a form that in the processing station microscope units can be mounted so as to be moved in and out, where these microscope units each have two divergent, but rather coaxial lenses which form images of the alignment marks of the opposing wafers, so that—mostly by using electronic image generators at the microscopes—a mutual alignment to coincidence of the images of the alignment marks becomes possible. The alignment accuracy depends on the accuracy of the alignment of the two lenses with respect to the measuring axis. Because the microscope units are mounted and can be moved in and out between the wafers, the same must be mounted in the processing station at a large distance from each other during the adjustment and be moved with respect to each other only subsequently, where first of all the microscope units must be moved out of the area of adjustment. When the optical measuring axes of the microscope units do not precisely correspond with each other and with the axis of movement of the actuator joining the wafers, or when a clearance of the actuator provides for only minimum lateral deviations, virtually non-correctable errors occur during the joining of the wafers. The large distances of the wafers to be maintained merely for moving in and out the microscope units are not necessary as such for the normal production and lead to an unnecessary complication in the total design of the processing station and to the adjustment errors mentioned above. In other known methods there should be used wafers with alignment marks mounted on both sides so as to coincide with each other. In this case, the adjustment can be effected by means of appropriate microscopes according to the alignment marks pointing to the outside, and shorter adjusting paths or distances between the wafers are required, but here as well the processing station is loaded by the microscopes, and the adjustment accuracy depends on the accuracy with which the additional outer alignment marks are provided, for which additional processing steps must be performed.

SUMMARY OF THE INVENTION

It is the object of the invention to create a method as described above and an apparatus suitable for performing said method, by means of which method or apparatus a high alignment accuracy between the wafers can be achieved, while the design of the processing station is simplified.

In terms of a method, this object is solved in accordance with the invention in that the substrate carrier for the one semiconductor substrate is at least movable in a coordinate direction approximately parallel to the main plane of the semiconductor substrate from a processing station into a measuring station, and the other substrate carrier is movable in the three coordinate directions, is rotatable about an axis normal to the main plane of the semiconductor substrate carried by the same, and for wedge error compensation is adjusted in its tilted position with respect to the other substrate carrier, where via measuring and control means set positions of the substrate carriers are detected and reproduced, that in the measuring stations the two lenses of the microscope units are mounted at a distance from each other and facing towards each other, so that the substrate carriers with the substrates can be introduced between the same, where these substrate carriers are moved into the measuring station one after the other, and upon introduction of the first substrate carrier, the microscope units with their corresponding lenses are adjusted to the alignment marks of the semiconductor substrate held at the first substrate carrier, this first substrate carrier is then moved back, and the second substrate carrier now introduced is adjusted to the other lenses of the microscope units, even if the microscope setting remains unchanged, for aligning the alignment marks of the semiconductor substrate carried by the same, and that finally the substrate carriers are joined with the aligned semiconductor substrates outside the measuring station.

By providing the microscope units outside the processing station in a separate measuring station, a considerable simplification is achieved in terms of design and size of the processing station, and in particular the adjusting paths to be maintained for joining the wafers can be reduced to the necessary extent. Since the microscope units have lenses facing towards each other—which may in turn be connected with electronic image generators to simplify the monitoring—the microscope units are not moved between the wafers, as in the known methods, but the wafers are moved between the lenses of the microscope units, where the distance of the lenses of a lens pair should substantially only cover the thickness of a substrate carrier and the wafer lying thereon.

It is common practice to withdraw the wafers from magazines and lay the same onto the substrate carriers by means of corresponding devices, on which substrate carriers they are fixed for instance by a vacuum or also by electrostatic forces. In the magazines, the wafers are mostly aligned equal to each other and accordingly bear the respective alignment marks pointing to the same side. Accordingly, the mechanical alignment aids, i.e. the above-mentioned flats or notches, are present in both wafers to be joined in the same arrangement with respect to the alignment marks. Substantially identical conditions are obtained when the wafers are roughly aligned in a preadjusting station, mostly by using auxiliary optical means. In consideration of these facts, a simplification of the necessary adjusting and working operations is achieved in the method in accordance with the invention in that both semiconductor substrates are laid and onto the associated substrate carriers with alignment marks pointing towards the same side, and fixed, and when the associated substrate has been laid onto the one substrate carrier, the same is turned for predetermining the desired opposite position of the two substrates.

A preferred apparatus for performing the method in accordance with the invention has the basic design already mentioned above, and in accordance with the invention is characterized in that by means of guideways and actuators both substrate carriers can be moved one after the other from the processing station into a measuring station and back into the processing station, where the microscope units are adjustably mounted in the measuring station with lenses disposed at a distance from each other and facing towards each other, and upon introducing the first substrate carrier can be adjusted to its alignment marks by means of their lenses directed to the corresponding side of the semiconductor substrate, whereas the second substrate carrier can be adjusted by means of its actuators according to the alignment marks of the semiconductor substrate carried by the same to the lenses directed to the other side of the microscope units maintaining their setting, and in this alignment can be moved back into the processing station, in which the semiconductor substrates can now be joined in mutual alignment.

The advantages of this apparatus have already been explained in conjunction with the method in accordance with the invention. In addition, it should be noted here that higher-ranking control means, e.g. one or several computers, are being used, which are connected with the actuators and other adjusting means for the substrate carriers and the microscope units as well as with associated measuring systems and can detect any momentary position of the substrate carriers or microscopes and can activate the movement to any desired or required position. Properly speaking, all kinds of actuators and control means are possible, where for the exact settings there may for instance be used micrometer drives coupled with step motors. In accordance with a particularly simple and reliable embodiment the guideways of both substrate carriers are designed as guide blocks.

It has already been mentioned that for joining purposes there is also desired a parallel position of the two sides of the wafers facing towards each other and thus to be joined. In terms of apparatus, this is achieved in accordance with the invention in that the guide block of the second substrate carrier in turn rests on a carrier, which by means of guideways and actuators can be moved in three coordinate directions and can be rotated about the Z-axis of the system of coordinates, where for an adjustment in the direction of the Z-axis, as is known per se, at least three actuators are used, which under control can be adjusted both jointly for a parallel movement of the carrier and individually for a tilted position of the carrier to achieve a wedge error compensation.

For the wedge error compensation it is possible according to one variant to support the carrier on the actuators via pressure sensors and by means of the actuators set the second substrate carrier against the first substrate carrier until it touches the wafers, where each pressure sensor first of all switches off the associated actuator via the control means upon occurrence of a certain desired pressure, so that when all actuators have been shut off, the wafers rest against each other with uniform pressure. This setting is stored and can be reactivated by the control means at any time, where in practice the procedure is such that first of all the wedge error compensation is made and only then the adjustment according to the alignment marks is made in the measuring station. Instead of the pressure sensors, there may also be used other known measuring means sensitive to the approach or contact of the wafers to be joined, e.g. pneumatic or electrostatic sensors, when during the wedge error compensation a direct contact of the two wafers should be avoided and the same should only be joined in the fully aligned condition.

According to one embodiment of the above described preferred aspect, the carrier is supported on the actuators so as to be slidable to a limited extent via contact pressure sensors, and for a vertical and lateral guidance of the carrier there are used at least two oblong, parallel leaf springs, which act against the same under a flat angle of attack, and whose other ends are fixed at stationary components. These leaf springs first of all ensure a uniform contact pressure of the carrier on the sensors and prevent that the same is lifted off these sensors. However, it is particularly advantageous that in the above-mentioned arrangement the springs form an extremely simple vertical guidance, where the adjusting path of the carrier is defined without clearance, so that with relatively simple means a very high accuracy can be achieved in the vertical setting and in the reproduction of vertical settings to be activated.

BRIEF DESCRIPTION OF THE DRAWING

Further details and advantages of the subject-matter of the invention can be taken from the following description of the drawing.

In the drawing, the subject-matter of the invention is illustrated by way of example, wherein:

FIG. 2 shows a bottom view and a top view, respectively, of two guide blocks carrying the substrate carriers and the wafers held on the same, FIGS. 3a and b are schematic representations of a bottom view of the guide block of the first substrate carrier disposed in the measuring station before and after setting the microscope units onto alignment marks (not represented) of the substrate held on the substrate carrier, FIGS. 5 to 8 are schematic graphical representations of the entire apparatus with various settings of the substrate carriers during the execution of the method in accordance with the invention.

DESCRIPTION OF THE PREFERRED EMBODIMENT

Figure 1:
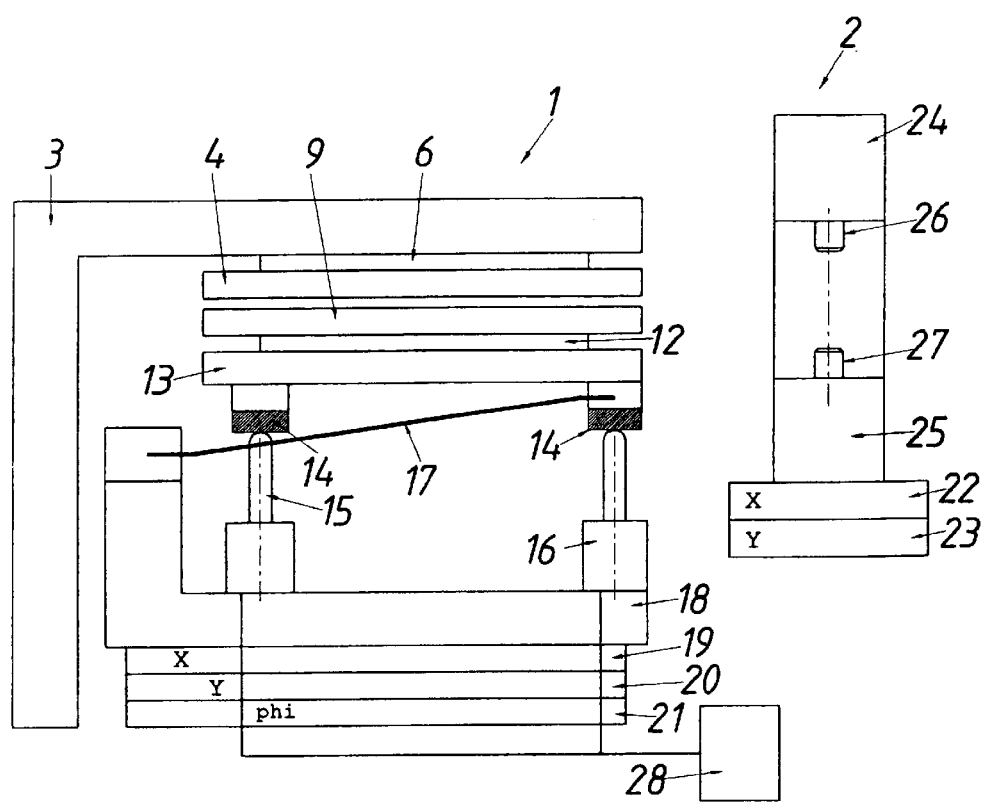
FIG. 1 shows a side view of an apparatus suitable for carrying out the method in accordance with the invention in a very schematic representation.
Figure 4:
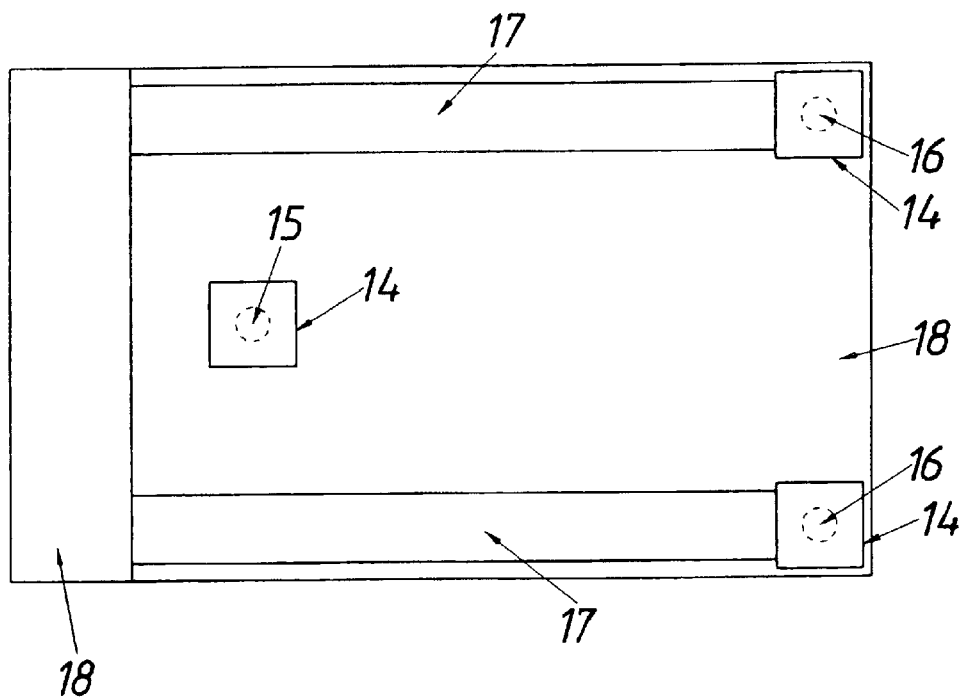
FIG. 4 is a top view of this supporting device for the second substrate carrier with the substrate carrier removed.

As shown in FIG. 1, the inventive apparatus basically consists of a processing station 1 and a measuring station 2 disposed beside the same, where between these two stations a not represented station for supplying wafers may be provided, from which the wafers can individually be placed onto substrate carriers after having been withdrawn from a magazine.

The processing station 1 has a supporting frame 3, on which a guide block 4 with a first substrate carrier 5 is mounted so as to be moved by means of a guiding and drive unit 6 in the X-direction of the system of coordinates into the measuring station 2 and back into the processing station 1. The substrate carrier 5 is held in the guide block 4 by means of a motor 7 such that facing upwards it can receive and retain a semiconductor substrate, namely a wafer 8, and is then turned, so that now the wafer 8 is pointing downwards with its free visible side carrying the not represented alignment marks and in this position is first of all moved back into the defined position in the processing station.

Below the guide block 4 there is provided another guide block 9 with in this case a stationary substrate carrier 10 for holding a second wafer 11 (semiconductor substrate), which by means of a drive and actuating unit 12 is supported on a carrier 13. The guide block 9 as well can be moved by means of the drive and actuating unit 12 in the X-direction of the system of coordinates into the measuring station 2 and back into a defined starting position. The carrier 13 with its contact pressure sensors 14 rests on three actuators 15, 16, where the two actuators 16 cooperate with two leaf springs 17 used for vertical guidance (see FIG. 5), which are mounted on a holder 18 unter a flat angle of attack. The holder 18 can in turn be moved in the X- and Y-directions of the system of coordinates via drive and actuating units 19, 20, 21, and can slightly be rotated about a vertical axis.

In the measuring station 2, two microscope units each with two lenses 26, 27 coaxially directed towards each other are provided on microscope carriers 24, 25 movable in the X- and Y-directions of the system of coordinates via actuators 22, 23. The drive and actuating units 6, 12, 19–21, 22, 23 and also the pressure sensors 14 as well as the actuators 15, 16 are connected with a central computer 28, of which FIG. 1 only represents the connection with the actuators 15, 16. According to FIGS. 5–8, the processing station 1 and the measuring station 2 are provided on a common base plate 29.

The adjustment and joining of the two wafers 8, 11 in accordance with the inventive method are effected as follows:

From the starting position shown in FIG. 1, the guide block 4 is first of all moved into a loading station, and a wafer 8 is placed onto the substrate carrier 5 (FIG. 2) with the visible side facing upwards. Subsequently, the substrate carrier 5 is turned by 180° by means of the motor 7, so that now the visible side of the wafer 8 provided with the alignment marks, which wafer is held for instance by suction, is facing downwards. The guide block 4 is now moved back into the starting position shown in FIG. 1, which starting position is clearly defined by monitoring the measuring systems integrated in the drive unit 6.

The guide block 9 now moves out of the processing station 1 and is charged with a wafer 11, whose visible side is facing upwards, and this wafer 11 is fixed at the substrate carrier 10. The guide block 9 is then also moved back into the starting position, in which by a corresponding adjustment of the drive and measuring unit 12 it retains the wafer 11 first of all at a distance from the wafer 8 so that they are disposed opposite each other. Now, the guide block 9 with the substrate carrier 10 and the wafer 11 is lifted by moving the carrier 13 by means of the actuators 15, 16, until corresponding signals of the contact pressure sensors 14 indicate that a uniform contact pressure of the wafer 11 against the wafer 8 has been reached, so that the two wafers lie flat against each other. The corresponding position of the actuating units 15, 16, 19–21 is stored. Subsequently, the carrier 13 is moved downwards to a predetermined extent by means of the actuators 15, 16. The wafer 8 now released together with the guide block 4 is moved into the aligning station 2 by means of the drive and actuating means 6. For moving in the guide block 4 together with the substrate carrier 5 and the wafer 8, the microscope units 26, 27 with their carriers 24, 25 are moved by means of the actuators 22, 23 from the position shown in FIG. 5 first of all away from each other into the position shown in FIG. 6 and FIG. 3a at the top. Now, the microscope units are moved towards each other (FIG. 8 and FIG. 3b, respectively) and by adjustment in the X- and Y-directions are precisely set with their upwardly facing lenses 27 onto the alignment marks of the wafer 8 and fixed in this position. The guide block 4 now moves back into the defined starting position shown in FIGS. 1, 5 and 8 and is fixed in this starting position. Now, the guide block 9 is moved by means of the drive means 12, until the wafer 11 provided on its substrate carrier 10 is disposed between the lenses 26, 27 of the microscope units. These microscope units now remain fixed, and the guide block 9 is moved by means of the actuators 19–21 by moving the carrier 13 until the alignment marks of the wafer 11 have been detected by the downwardly facing lenses 26 of the microscope units, which means that the same condition exists as if both wafers 8, 11 were present in the aligning station, and their alignment marks were exactly aligned with respect to each other and to the axes of the microscope units 26, 27. Now, the guide block 9 is moved back into the starting position inside the processing station 1, and by a controlled actuation of the actuators 15, 16 is moved into the position in which the wafer 11 is pressed against the wafer 8 already present in the processing station 1, so that now the two wafers precisely aligned with respect to each other according to the alignment marks can be joined. The fixation of the aligned wafers 8, 11 touching each other can be effected according to conventional methods. The wafers 8, 11 can for instance be fixed against each other mechanically, unless due to corresponding surfaces or surface structures of the wafers 8, 11 a mutual fixation is already ensured by the contact pressure, e.g. by the van der Waals forces.

Minor modifications of the inventive method are of course possible. It is for instance possible to perform the alignment of the lenses 27 of the lower microscope units 25 in the measuring station to the alignment marks of the wafer 8 directly after placing this wafer 8 onto the substrate carrier 5, and only then move back into the starting position of the guide block 4. With a correspondingly divided guide block 9, the actuating units 19, 20, 21 can also be mounted on the lower half of this guide block in accordance with one variant, so that they can align the lower half of the guide block with the substrate carrier 10 and the wafer 11 directly in the measuring station 2.

What is claimed is:

1. A method for the aligned joining of disk-shaped semiconductor substrates, so-called wafers, provided with alignment marks, which are held on substrate carriers, wherein the wafers are adjusted to a parallel position of their sides facing towards each other, are aligned according to alignment marks provided on these sides, and are then joined, where for detecting the alignment marks to be brought to coincidence there are used microscope units with coaxial lenses directed towards opposite sides, characterized in that the substrate carrier for the one semiconductor substrate is at least movable in a coordinate direction approximately parallel to the main plane of the semiconductor substrate from a processing station into a measuring station, and the other substrate carrier is movable in the three coordinate directions, is rotatable about an axis normal to the main plane of the semiconductor substrate carried by the same, and for wedge error compensation is adjusted in its tilted position with respect to the other substrate carrier, where via measuring and control means set positions of the substrate carriers are detected and reproduced, that in the measuring station the two lenses of the microscope units are mounted at a distance from each other and facing towards each other, so that the substrate carriers with the substrates can be introduced between the same, where these substrate carriers are moved into the measuring station one after the other, and upon introduction of the first substrate carrier, the microscope units with their corresponding lenses are adjusted to the alignment marks of the semiconductor substrate held at the first substrate carrier, this first substrate carrier is then moved back, and the second substrate carrier now introduced is adjusted to the other lenses of the microscope units, even if the microscope setting remains unchanged, for aligning the alignment marks of the semiconductor substrate carried by the same, and that finally the substrate carriers are joined with the aligned semiconductor substrates outside the measuring station.

2. The method as claimed in claim 1, characterized in that both semiconductor substrates with alignment marks facing towards the same side are placed onto the associated substrate carriers and fixed, and upon applying the associated substrate, the one substrate carrier is turned so as to predetermine the desired opposite position of the two substrates.

3. Apparatus for performing the method as claimed in claim 1, comprising a processing station used for joining the semiconductor substrates having alignment marks, in which processing station two substrate carriers are provided for holding one semiconductor substrate each, of which the second substrate carrier can be moved with respect to the first substrate carrier in the three coordinate directions by means of actuators and can be rotated about an axis extending normal to the supporting plane of the semiconductor substrate, measuring means and actuators for determining and adjusting the relative positions of the two substrate carriers and of the substrates held on the same, and microscope units with coaxial lenses directed towards opposite sides for monitoring the mutual alignment of the semiconductor substrates by detecting pairs of alignment marks provided on their sides to be mounted opposite each other, characterized in that by means of guideways (4, 9) and actuators (6, 12, 19–21) both substrate carriers (5, 10) can be moved one after the other from the processing station (1) into a measuring station (2) and back into the processing station (1), where the microscope units are adjustably mounted in the measuring station with lenses (26, 27) disposed at a distance from each other and facing towards each other, and upon introducing the first substrate carrier (5) can be adjusted to its alignment marks by means of their lenses (27) directed to the corresponding side of the semiconductor substrate, whereas the second substrate carrier (10) can be adjusted by means of its actuators (19–21) according to the alignment marks of the semiconductor substrate (11) carried by the same to the lenses (26) directed to the other side of the microscope units maintaining their setting, and in this alignment can be moved back into the processing station (1), in which the semiconductor substrates (8, 11) can now be joined in mutual alignment.

4. The apparatus as claimed in claim 3, characterized in that the guideways of both substrate carriers (5, 10) are designed as guide blocks (4, 9).

5. The apparatus as claimed in claim 3, characterized in that the guide block (9) of the second substrate carrier (10) in turn rests on a carrier (13), which by means of guideways and actuators (5, 16, 19, 20, 21) can be moved in the three coordinate directions and can be rotated about the Z-axis of the system of coordinates, where for an adjustment in the direction of the Z-axis, as is known per se, at least three actuators (15, 16) are used, which under control can be adjusted both jointly for a parallel movement of the carrier (13) and individually for a tilted position of the carrier (13) to achieve a wedge error compensation.

6. The apparatus as claimed in claim 5, characterized in that the carrier (13) is supported on the actuators (15, 16) so as to be slidable to a limited extent via contact pressure sensors (14), and for a vertical and lateral guidance of the carrier (13) there are used at least two oblong, parallel leaf springs (17), which act against the same under a flat angle of attack, and whose other ends are fixed at stationary components (18).

* * * * *